(12) United States Patent
Lin

(10) Patent No.: US 11,527,464 B2
(45) Date of Patent: *Dec. 13, 2022

(54) FAN-OUT WAFER LEVEL PACKAGE STRUCTURE

(71) Applicant: Taiwan Semiconductor Manufacturing Co., Ltd., Hsinchu (TW)

(72) Inventor: Jing-Cheng Lin, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 107 days.

This patent is subject to a terminal disclaimer.

(21) Appl. No.: 17/068,310

(22) Filed: Oct. 12, 2020

(65) Prior Publication Data

US 2021/0028097 A1 Jan. 28, 2021

Related U.S. Application Data

(60) Continuation of application No. 16/166,592, filed on Oct. 22, 2018, now Pat. No. 10,804,187, which is a
(Continued)

(51) Int. Cl.
*H01L 23/538* (2006.01)
*H01L 23/498* (2006.01)
(Continued)

(52) U.S. Cl.
CPC .. *H01L 23/49816* (2013.01); *H01L 23/49811* (2013.01); *H01L 23/49822* (2013.01);
(Continued)

(58) Field of Classification Search
CPC ............ H01L 23/5389; H01L 23/49833
See application file for complete search history.

(56) References Cited

U.S. PATENT DOCUMENTS 5,600,541 A 2/1997 Bone et al.
5,977,640 A 11/1999 Bertin et al.
(Continued)

FOREIGN PATENT DOCUMENTS

CN 101315924 A 12/2008
CN 102034718 A 4/2011
(Continued)

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method for forming a package structure may comprise applying a die and vias on a carrier having an adhesive layer and forming a molded substrate over the carrier and around the vias, and the ends of the vias and mounts on the die exposed. The vias may be in via chips with one or more dielectric layers separating the vias. The via chips 104 may be formed separately from the carrier. The dielectric layer of the via chips may separate the vias from, and comprise a material different than, the molded substrate. An RDL having RDL contact pads and conductive lines may be formed on the molded substrate. A second structure having at least one die may be mounted on the opposite side of the molded substrate, the die on the second structure in electrical communication with at least one RDL contact pad.

20 Claims, 5 Drawing Sheets

Related U.S. Application Data continuation of application No. 15/206,638, filed on Jul. 11, 2016, now Pat. No. 10,109,567, which is a division of application No. 13/656,053, filed on Oct. 19, 2012, now Pat. No. 9,391,041.

(51) Int. Cl.

| | | |
|---|---|---|
| *H01L 25/10* | (2006.01) | |
| *H01L 23/00* | (2006.01) | |
| *H01L 25/03* | (2006.01) | |
| *H01L 25/00* | (2006.01) | |

(52) U.S. Cl.
CPC .. *H01L 23/49827* (2013.01); *H01L 23/49833* (2013.01); *H01L 23/5389* (2013.01); *H01L 24/09* (2013.01); *H01L 24/19* (2013.01); *H01L 24/20* (2013.01); *H01L 25/105* (2013.01); *H01L 25/03* (2013.01); *H01L 25/50* (2013.01); *H01L 2224/12105* (2013.01); *H01L 2224/16145* (2013.01); *H01L 2224/16146* (2013.01); *H01L 2224/16225* (2013.01); *H01L 2224/16227* (2013.01); *H01L 2224/16235* (2013.01); *H01L 2224/73259* (2013.01); *H01L 2224/9222* (2013.01); *H01L 2225/1035* (2013.01); *H01L 2225/1058* (2013.01); *H01L 2924/1436* (2013.01); *H01L 2924/15311* (2013.01); *H01L 2924/181* (2013.01); *H01L 2924/18162* (2013.01)

(56) References Cited

U.S. PATENT DOCUMENTS

| | | |
|---|---|---|
| 6,153,290 A | 11/2000 | Sunahara |
| 6,281,046 B1 | 8/2001 | Lam |
| 6,335,565 B1 | 1/2002 | Miyamoto et al. |
| 7,105,920 B2 | 9/2006 | Su et al. |
| 7,545,047 B2 | 6/2009 | Bauer et al. |
| 7,573,136 B2 | 8/2009 | Jiang et al. |
| 7,619,901 B2 | 11/2009 | Eichelberger et al. |
| 7,795,721 B2 | 9/2010 | Kurita |
| 7,838,337 B2 | 11/2010 | Marimuthu et al. |
| 7,969,009 B2 | 6/2011 | Chandrasekaran |
| 8,093,722 B2 | 1/2012 | Chen et al. |
| 8,097,490 B1 | 1/2012 | Pagaila et al. |
| 8,105,875 B1 | 1/2012 | Hu et al. |
| 8,138,014 B2 | 3/2012 | Chi et al. |
| 8,143,097 B2 | 3/2012 | Chi et al. |
| 8,263,439 B2 | 9/2012 | Marimuthu et al. |
| 8,293,580 B2 | 10/2012 | Kim et al. |
| 8,361,842 B2 | 1/2013 | Yu et al. |
| 8,435,835 B2 | 5/2013 | Pagaila et al. |
| 8,476,769 B2 | 7/2013 | Chen et al. |
| 8,482,118 B2 | 7/2013 | Mohan et al. |
| 8,503,186 B2 | 8/2013 | Lin et al. |
| 8,508,045 B2 | 8/2013 | Khan et al. |
| 8,604,568 B2 | 12/2013 | Stacey |
| 8,604,615 B2 | 12/2013 | Lee et al. |
| 8,710,657 B2 | 4/2014 | Park et al. |
| 8,736,035 B2 | 5/2014 | Hwang et al. |
| 8,754,514 B2 | 6/2014 | Yu et al. |
| 8,791,016 B2 | 7/2014 | Gambino et al. |
| 8,841,748 B2 | 9/2014 | Joblot et al. |
| 8,872,319 B2 | 10/2014 | Kim et al. |
| 8,928,114 B2 | 1/2015 | Chen et al. |
| 8,941,235 B2 | 1/2015 | Pendse |
| 8,957,525 B2 | 2/2015 | Lyne et al. |
| 8,975,726 B2 | 3/2015 | Chen et al. |
| 9,048,306 B2 | 6/2015 | Chi et al. |
| 9,087,832 B2 | 7/2015 | Huang et al. |
| 9,087,835 B2 | 7/2015 | Sutardja et al. |
| 9,373,527 B2 | 6/2016 | Yu et al. |
| 9,455,313 B1 | 9/2016 | Christensen et al. |
| 9,768,048 B2 | 9/2017 | Lin et al. |
| 2002/0117743 A1 | 8/2002 | Nakatani et al. |
| 2003/0001240 A1 | 1/2003 | Whitehair et al. |
| 2003/0116856 A1 | 6/2003 | Tomsio et al. |
| 2003/0219969 A1 | 11/2003 | Saito et al. |
| 2004/0095734 A1 | 5/2004 | Nair |
| 2004/0187297 A1 | 9/2004 | Su et al. |
| 2004/0256731 A1 | 12/2004 | Mao et al. |
| 2006/0043549 A1 | 3/2006 | Hsu |
| 2006/0063312 A1 | 3/2006 | Kurita |
| 2006/0133056 A1 | 6/2006 | Wyrzykowska et al. |
| 2007/0161266 A1 | 7/2007 | Nishizawa |
| 2007/0181974 A1 | 8/2007 | Coolbaugh et al. |
| 2008/0006936 A1 | 1/2008 | Hsu |
| 2008/0142976 A1 | 6/2008 | Kawano |
| 2008/0220563 A1 | 9/2008 | Kamezos |
| 2008/0277800 A1 | 11/2008 | Hwang et al. |
| 2009/0057862 A1 | 3/2009 | Ha et al. |
| 2009/0155957 A1 | 6/2009 | Chen et al. |
| 2009/0230535 A1 | 9/2009 | Otremba et al. |
| 2010/0112756 A1 | 5/2010 | Amrine et al. |
| 2010/0127345 A1 | 5/2010 | Sanders et al. |
| 2010/0133704 A1 | 6/2010 | Marimuthu et al. |
| 2010/0140779 A1 | 6/2010 | Lin et al. |
| 2010/0155126 A1 | 6/2010 | Kunimoto et al. |
| 2010/0155922 A1 | 6/2010 | Pagaila et al. |
| 2010/0193221 A1 | 8/2010 | Schoeffmann et al. |
| 2010/0230823 A1 | 9/2010 | Ihara |
| 2010/0237482 A1 | 9/2010 | Yang et al. |
| 2010/0243299 A1 | 9/2010 | Kariya et al. |
| 2011/0024902 A1 | 2/2011 | Lin et al. |
| 2011/0024916 A1 | 2/2011 | Marimuthu et al. |
| 2011/0037157 A1 | 2/2011 | Shin et al. |
| 2011/0062592 A1 | 3/2011 | Lee et al. |
| 2011/0090570 A1 | 4/2011 | DeCusatis et al. |
| 2011/0156247 A1 | 6/2011 | Chen et al. |
| 2011/0163391 A1 | 7/2011 | Kinzer et al. |
| 2011/0163457 A1 | 7/2011 | Mohan et al. |
| 2011/0186960 A1 | 8/2011 | Wu et al. |
| 2011/0186977 A1 | 8/2011 | Chi et al. |
| 2011/0204509 A1 | 8/2011 | Lin et al. |
| 2011/0215464 A1 | 9/2011 | Guzek et al. |
| 2011/0241218 A1 | 10/2011 | Meyer et al. |
| 2011/0260336 A1 | 10/2011 | Kang et al. |
| 2011/0278736 A1 | 11/2011 | Lin et al. |
| 2011/0285005 A1 | 11/2011 | Lin et al. |
| 2012/0032340 A1 | 2/2012 | Choi et al. |
| 2012/0038053 A1 | 2/2012 | Oh et al. |
| 2012/0049346 A1 | 3/2012 | Lin et al. |
| 2012/0056312 A1 | 3/2012 | Pagaila et al. |
| 2012/0139068 A1 | 6/2012 | Stacey |
| 2012/0161315 A1 | 6/2012 | Lin et al. |
| 2012/0208319 A1 | 8/2012 | Meyer et al. |
| 2012/0217643 A1 | 8/2012 | Pagalia et al. |
| 2012/0273960 A1 | 11/2012 | Park et al. |
| 2012/0319294 A1 | 12/2012 | Lee et al. |
| 2012/0319295 A1 | 12/2012 | Chi et al. |
| 2013/0009322 A1 | 1/2013 | Conn et al. |
| 2013/0009325 A1 | 1/2013 | Mori et al. |
| 2013/0044554 A1* | 2/2013 | Goel ............... G11C 29/816 365/200 |
| 2013/0062760 A1 | 3/2013 | Hung et al. |
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0111123 A1 | 5/2013 | Thayer |
| 2013/0181325 A1 | 7/2013 | Chen et al. |
| 2013/0182402 A1 | 7/2013 | Chen et al. |
| 2013/0234322 A1 | 9/2013 | Pendse |
| 2013/0256836 A1 | 10/2013 | Hsiao et al. |
| 2013/0307155 A1 | 11/2013 | Mitsuhashi |
| 2013/0334697 A1 | 12/2013 | Shin et al. |
| 2014/0070422 A1* | 3/2014 | Hsiao ............... H01L 25/0657 438/618 |
| 2014/0091473 A1 | 4/2014 | Len et al. |
| 2014/0103488 A1 | 4/2014 | Chen et al. |
| 2014/0183731 A1 | 7/2014 | Lin et al. |
| 2014/0264836 A1 | 9/2014 | Chun et al. |
| 2014/0367828 A1 | 12/2014 | Colonna et al. |

(56) References Cited

U.S. PATENT DOCUMENTS

| | | |
|---|---|---|
| 2015/0093881 A1 | 4/2015 | Chen et al. |
| 2015/0096798 A1 | 4/2015 | Uzoh |
| 2015/0102464 A1 | 4/2015 | Kang et al. |
| 2015/0115464 A1 | 4/2015 | Yu et al. |
| 2015/0115470 A1 | 4/2015 | Su et al. |
| 2015/0155203 A1 | 6/2015 | Chen et al. |
| 2016/0148991 A1 | 5/2016 | Erickson et al. |
| 2016/0293577 A1 | 10/2016 | Yu et al. |
| 2016/0322330 A1 | 11/2016 | Lin et al. |

FOREIGN PATENT DOCUMENTS

| | | |
|---|---|---|
| CN | 102157391 A | 8/2011 |
| KR | 20110025699 A | 3/2011 |
| KR | 101099578 B1 | 12/2011 |
| KR | 20120060486 A | 6/2012 |
| KR | 1020120094182 A | 8/2012 |
| KR | 1020120075855 A | 9/2012 |
| KR | 1020120098844 A | 9/2012 |
| TW | 200919632 A | 5/2009 |
| TW | 201230266 A | 7/2012 |
| WO | 2011090570 A2 | 7/2011 |

OTHER PUBLICATIONS

Zhang, Y. et al., "Lead-Free Bumping and Its Challenges," IWPLC Conference Proceedings, Oct. 10, 2004, 8 pages.

\* cited by examiner

FAN-OUT WAFER LEVEL PACKAGE STRUCTURE

CROSS-REFERENCE TO RELATED APPLICATIONS

This application is a continuation of U.S. application Ser. No. 16/166,592, entitled "Fan-Out Wafer Level Package Structure," filed on Oct. 22, 2018, which is a continuation of U.S. application Ser. No. 15/206,638, entitled "Fan-Out Wafer Level Package Structure," filed on Jul. 11, 2016, now U.S. Pat. No. 10,109,567, issue on Oct. 23, 2018, which is a division of U.S. application Ser. No. 13/656,053, entitled "Fan-Out Wafer Level Package Structure," filed on Oct. 19, 2012, now U.S. Pat. No. 9,391,041, issued on Jul. 12, 2016, which applications are hereby incorporated herein by reference.

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between chips, and subsequent interconnect distance.

One method used to reduce the distance between various chips forming a system is to stack chips, with electrical interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces.

Additionally, a package-on-package structure may be mounted on another carrier, package, PCB, or the like, via a solder ball grid array (BGA), land grid array (LGA), or the like. In some instances, the separation of the individual interconnections in an array, or bond pitch, may not match the die within the package-on-page structure, or may require a different connection arrangement than within the package-on-package structure.

BRIEF DESCRIPTION OF THE DRAWINGS

For a more complete understanding of the present embodiments, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale. For clarity non-essential reference numbers are left out of individual figures where possible.

DETAILED DESCRIPTION OF ILLUSTRATIVE EMBODIMENTS

The making and using of the embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using fan-out structures useful in, for example, wafer level package assemblies. Other embodiments may also be applied, however, to other electrical components, including, but not limited to, mounting memory assemblies, displays, input assemblies, discrete components, power supplies or regulators or any other components.

Figure 10:
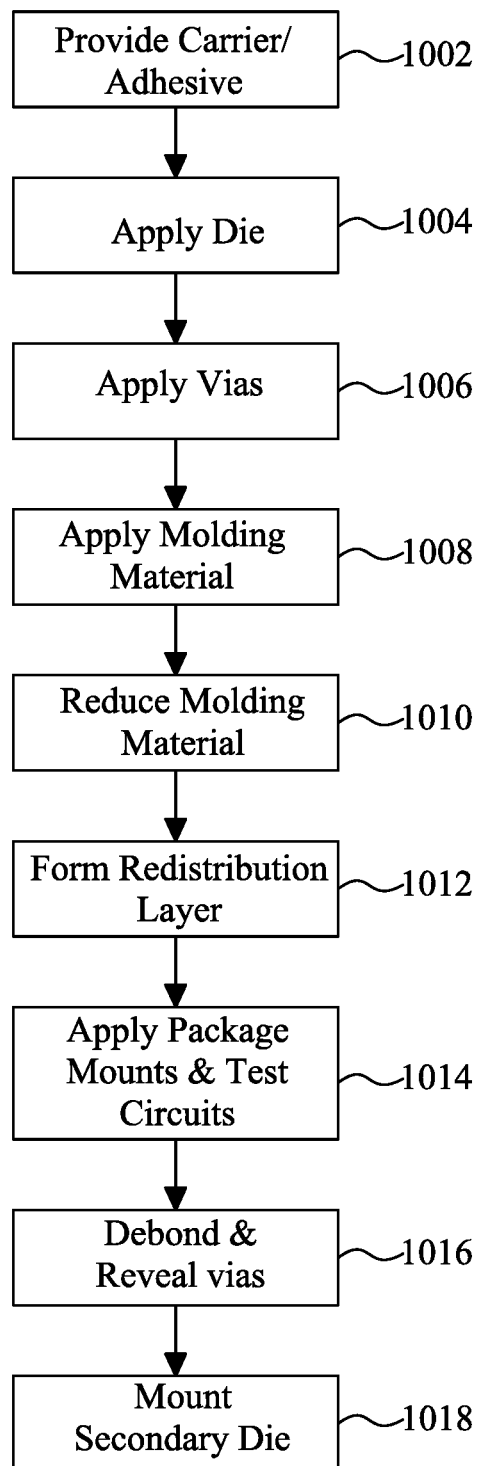
FIG. 10 is a flow diagram illustrating steps in an embodiment of a method for fabricating a fan-out wafer level package structure according to an embodiment of the disclosure.

FIG. 10 is a flow diagram illustrating steps in an embodiment of a method 1000 for fabricating a fan-out wafer level package structure. FIG. 10 is described in conjunction with FIGS. 1-7, which illustrate intermediate steps in the method 1000 for forming the fan-out wafer level packaging structure.

Figure 1:
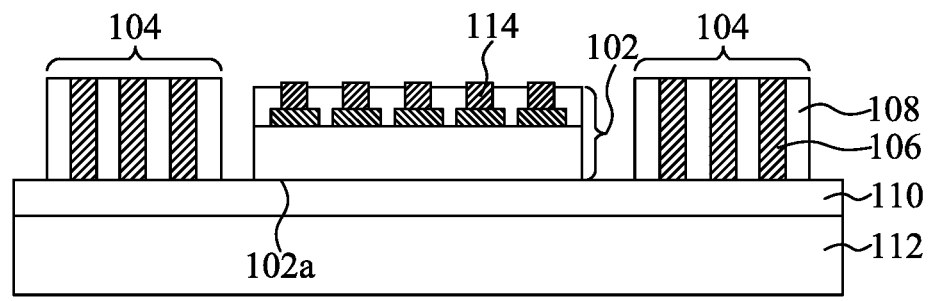
FIGS. 1-7 are cross-sectional diagrams illustrating intermediate steps in a method for fabricating a fan-out wafer level package structure according to an embodiment of the disclosure.

Initially referring to FIG. 10, a first step in an embodiment of a method 1000 for fabricating a fan-out wafer level package is shown in block 1002. A carrier 112 and optionally, an adhesive layer 110, may be provided as shown in FIG. 1. The carrier 112 may be configured to provide structural rigidity or a base for deposition of subsequent non-rigid layers. In one embodiment, the carrier 112 may be glass, but may alternatively be a wafer, semiconductor, metal, synthetic or other material having a suitable topography and structural rigidity.

The adhesive layer 110 may, in some embodiments, may be applied to the carrier 112. In one embodiment, the adhesive layer 110 may be adhesive tape or die attachment film (DAF), or alternatively, may be a glue or epoxy applied to the carrier 112 via a spin-on process, or the like. In some embodiments, the adhesive layer 110 may be used to separate the carrier 112 from the fan-out assembly (See FIG. 8, element 800) and associated devices or layers in subsequent steps.

A die 102 may be applied in block 1004, and as shown in FIG. 1. The application of the die 102 is not limited to application of a single die 102, as the presented disclosure may include more than one die 102. In some embodiments, the die 102 may have one or more mounts 114, which may for example, be contacts, pins, mounting pads, lands, or the like, for providing electrical connectivity to the circuit (not shown) within the die 102. The die 102 may be attached or otherwise mounted to the carrier 112 by way of the adhesive layer 110 or another suitable attachment method. The die 102 may be attached to the carrier 112 at the top surface 102a of the die 102 with the mounts 114 facing away from the carrier 112.

One or more vias 106 may be attached or otherwise created in block 1006, and as shown in FIG. 1. In one embodiment, the vias 106 may be formed within a via chip 104 which may be attached to the carrier 112 by way of the adhesive layer 110, or another suitable attachment means. In one embodiment, the via chip 104 may be placed by a pick-and-place apparatus. The via chip 104 may be comprised of one or more dielectric layers 108 and one or more vias 106 comprised of a substantially conductive material. In some embodiments, the vias 106 may be copper, or in other embodiments, the vias 106 may be aluminum, gold, palladium, silver, alloys of the same, or another conductive material. Additionally, the dielectric layers may be formed of material different than the molded substrate 202, and may separate the vias 104 from the molded substrate 202.

The via chips 104 may be formed prior to placement on the carrier 112, or vias 106 may be formed in situ on the carrier. Via chips 104, for example, may be formed as part of a larger structure. For example, multiple vias 106 or multiple via chips 104 may be formed in a single structure and then cut to a desired or predetermined size. For example, a dielectric may be etched or otherwise have via openings formed therein, and then the vias 106 may be formed by a deposition or plating process. Alternatively, the vias 106 may be milled, molded, deposited or formed with a dielectric 108 or molding compound prior to placement on the carrier 112.

Additionally, while the illustrated embodiment depicts a single die 102 with two via chips 104, one on each side of the die 102, the number and disposition of the via chips 104 and die 102 is not limited to the illustrated embodiment. For example, multiple dies 102 may be disposed on the carrier 112, with one via chip 104, or with more than two via chips 104 arranged around the dies 102.

Figure 2:
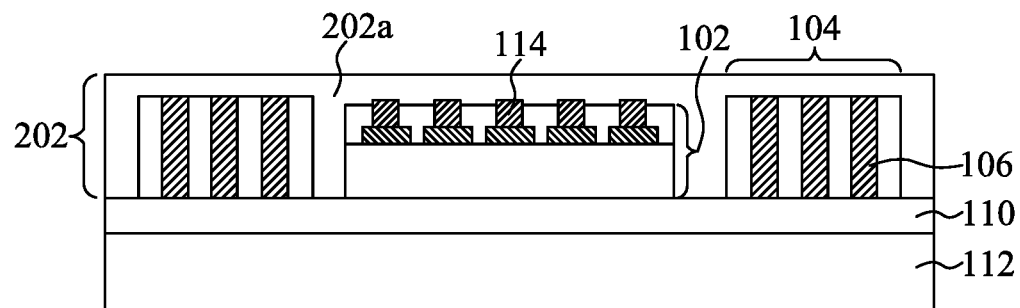

A molding compound 202a may be applied in block 1008, to form the molded substrate 202, as shown in FIG. 2. The molding compound 202a may be applied to the carrier 112, and may fill the area around the die 102 and via chip 104, and filling any gaps around the die 102 mounts 114 and vias 106. In one embodiment, the molded substrate 202 may be formed from a nonconductive material, such as an epoxy, a resin, a moldable polymer, or the like. The molding compound 202a may be applied while substantially liquid, and then may be cured through a chemical reaction, such as in an epoxy or resin. In another embodiment the molding compound 202a may be an ultraviolet (UV) or thermally cured polymer applied as a gel or malleable solid capable of being disposed around the die 102 and via chip 104. In an embodiment employing a UV or thermally cured molding compound 202a, the molded substrate 202 may be formed in place using a mold, for example, bordering the perimeter of the molded area, such as a wafer or package. Optionally, a release film may be applied prior to applying the molding compound 202a, permitting parting of a mold from the molded substrate 202, or from the carrier 112. A release film may be advantageous where the molding compound 202a is applied to the carrier 112 without an adhesive or other barrier between the molding compound 202a and carrier 112.

Figure 3:
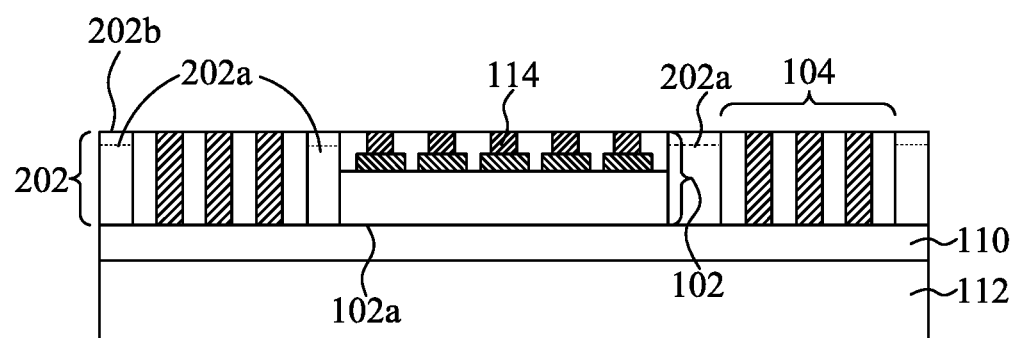

The molded substrate 202 may be reduced in block 1010, and as shown in FIG. 3. The molded substrate 202 may undergo, in some embodiments, a grinding step to remove excess material from the die 102 mounts 114 and vias 106. In such an embodiment, the molded substrate 202 may be subjected to a chemical-mechanical polish, a purely mechanical polish, chemical etching, or another suitable reduction process. The resulting reduced molded substrate 202 may, in some embodiments, have a top surface 202b at or below (represented in FIG. 3 by the dashed lines) the top surfaces of the vias 106 and the die 102 mounts 114. In some embodiments, first ends of the vias 106 and the die 102 mounts 114 may be substantially planar with a first side 202b of the molded substrate 202. Thus, the first ends of the vias 106 and the die 102 mounts 114 may be exposed at the polished or first side 202b of the reduced molded substrate 202 so that electrical contacts may be formed on the vias 106 and die 102 mounts 114. In some embodiments, the grinding may also reduce the height of the vias 106 or die 102 mounts 114.

Figure 4:
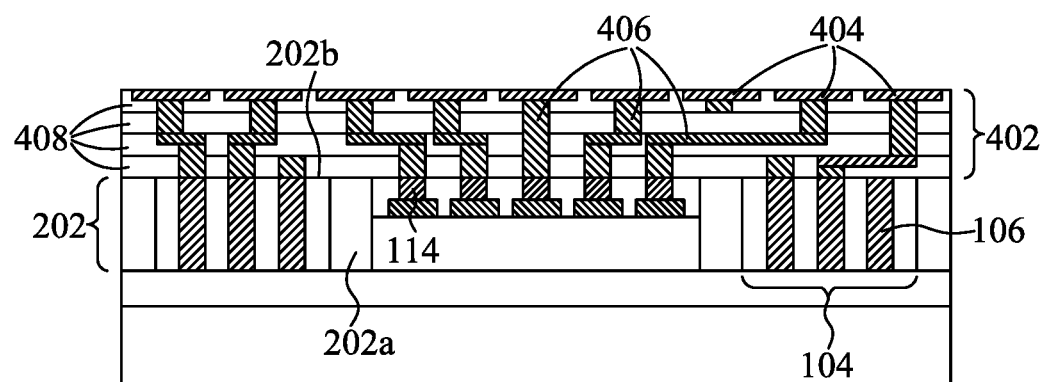

A first redistribution layer 402 (RDL) may be formed in block 1012, as shown in FIG. 4. The molded substrate 202 may have a RDL 402 disposed on one side 202b of the planarized or reduced surface. The RDL 402 may, in some embodiments, have one or more conductive lines 406 disposed in an intermetal dielectric (IMD) 408, and in electrical contact with RDL contact pads 404. The RDL 402 conductive lines 406 may further be in contact with one or more of the die 102 mounts 114 or one or more vias 106. The conductive lines 406 may fan out from one or more of the die 102 mounts 114 such that the RDL contact pads 404 may have a larger bond pitch than the die 102 mounts 114, and which may be suitable for a ball grid array or other package mounting system. In one embodiment, the RDL 402 may have conductive lines 406 configured to fan out and provide an electrical connection between the die 102 mounts 114 and RDL contact pads 404. In some embodiments, the RDL 402 may also have conductive lines 406 that connect one or more vias 106 to the RDL contact pads 404. In some embodiment, the conductive lines 406 may electrically connect, for example, a via 106 to another via 106, to a die 102 mount 114, or to another die 102 or device.

Figure 5:
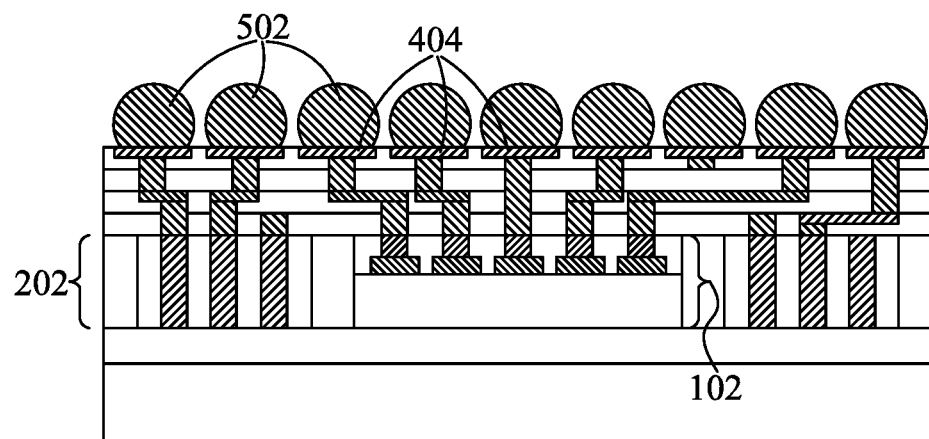

Package mounts 502 may be applied in block 1014 and as shown in FIG. 5, and the die 102 or circuit may then be tested. In one embodiment, the package mounts 502 may be applied to the RDL contact pads 404 as, for example, solder balls comprising a ball grid array. In another embodiment, the package mounts may be a land grid array (LGA), a pin array, or another suitable package attachment system.

Figure 6:
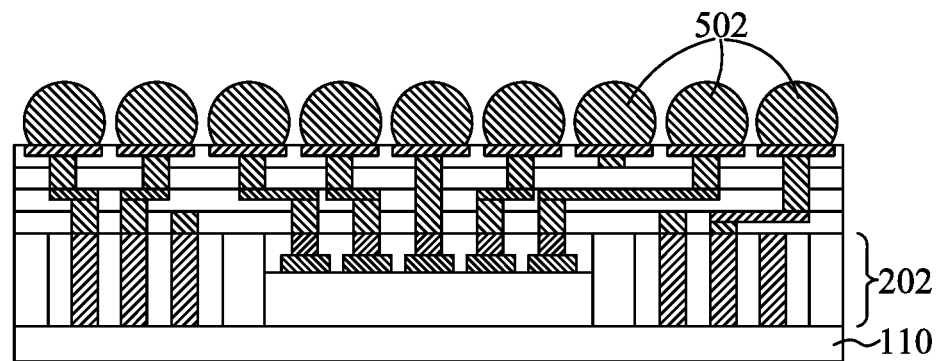

The carrier 112 may be debonded and the vias 106 exposed in block 1016. FIG. 6 illustrates a package with the carrier 112 debonded. The carrier 112 may be removed to expose the adhesive layer 110 where used, or to expose the vias and molded substrate. In one embodiment, the adhesive layer 110 may be softened or otherwise weakened through heat, ultraviolet light, or a solvent, and the carrier 112 separated from the molded substrate 202. In other embodiments, the carrier 112 may be removed through a grinding or polishing process.

Figure 7:
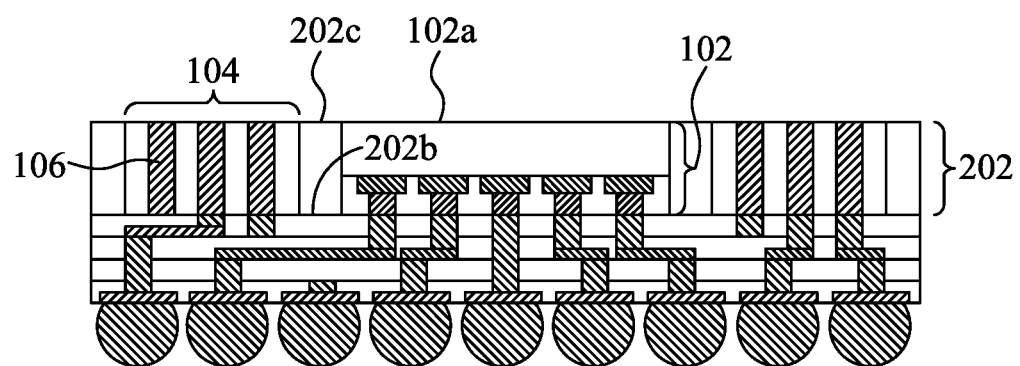

FIG. 7 illustrates a package according to an embodiment of the presented disclosure with the vias 106 exposed at the second side 202c of the molded substrate 202. The adhesive layer 110 may be removed mechanically, such as by grinding, chemical mechanical polishing, heating, or the like, or by other means, such as a solvent. In some embodiments, the adhesive layer 110 may be removed in the process of reducing or planarizing the second end of the vias 106 and second side 202c of the molded substrate 202. The adhesive layer 110 may also be removed as part of the process of removing the carrier 112. Thus, the second ends of the vias may be substantially planar with the second side 202c of the molded substrate 202. Additionally, the top surface 102a of the die 102 may be exposed through the second side of the molded substrate 202. The planarizing process applied to the second side 202c of the molded substrate 202 may also be used to bring the molded substrate 202 to a desired or predetermined thickness. For example, in one embodiment, the molded substrate 202 may be reduced to expose the top surface 102a of the die 102, resulting in a molded substrate having the about the same thickness as the height of the die 102, including the die 102 mounts 114.

Figure 8:
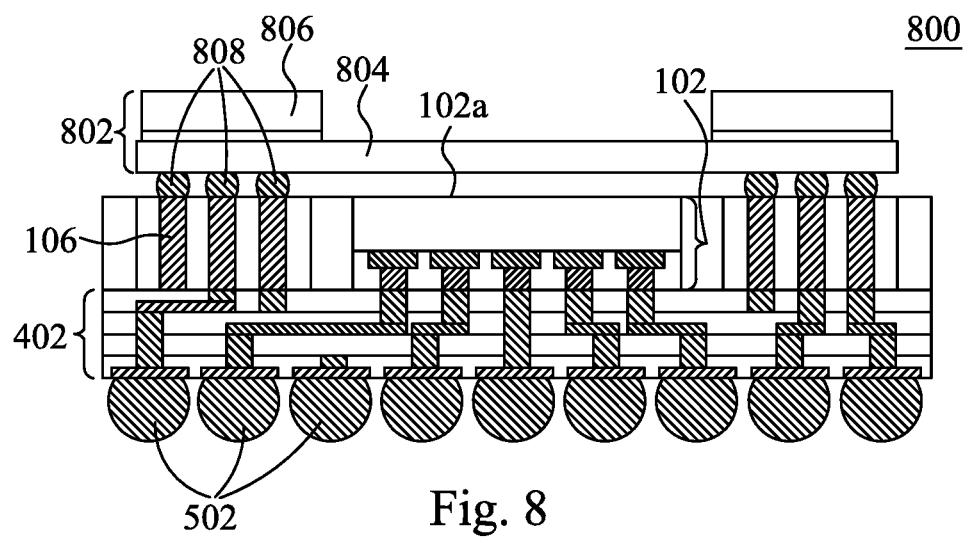
FIGS. 8-9 are cross-sectional diagrams illustrating embodiments of wafer level package structures fabricated according to embodiments of the disclosure.

A second structure 802 may be mounted in block 1018. FIG. 8 illustrates one embodiment of a fan-out wafer level package structure 800 fabricated according to the presented disclosure, with a secondary structure 802 or die mounted over a single die 102. In one embodiment, the second structure 802 may be mounted at a height where the bottom surface of the second structure 802 is separated from the top surface 102a of the die 102. In one embodiment, the second structure 802 may have a second substrate 804 and one or more structure connectors 808 may be applied to connect the second structure 802 to the vias 106. In one embodiment, the structure connectors 808 may be solder balls applied to lands on the bottom of the second structure 802. In another embodiment, the structure connectors 808 may be solder paste, a conductive adhesive, or the like.

Figure 9:
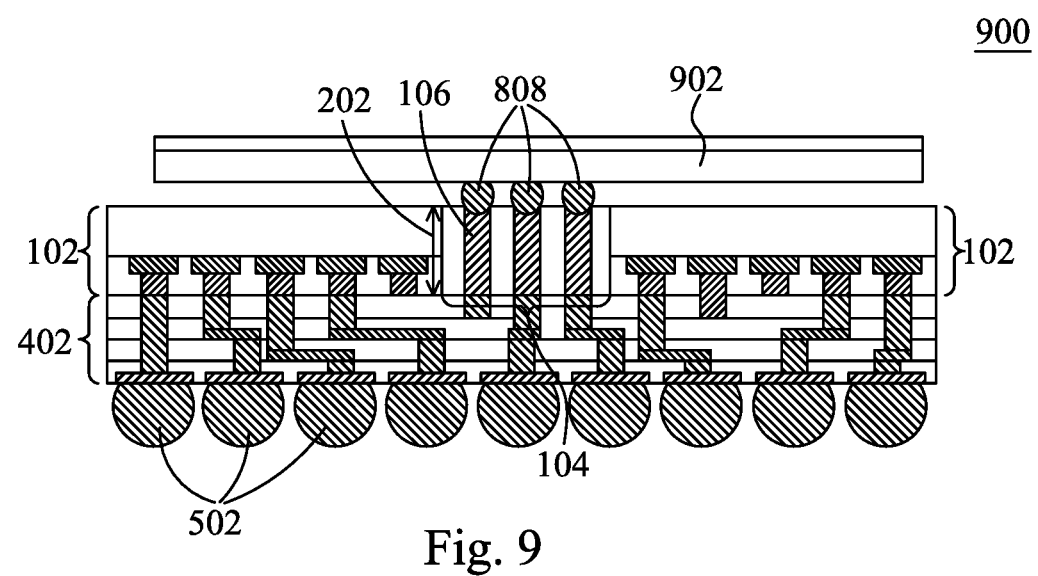

FIG. 9 illustrates another embodiment of a second fan-out wafer level package structure 900 fabricated according to the presented disclosure. A second structure 902 may, in one embodiment, be for example, a die with a pin array, such as in a wide I/O DRAM Chip. In such an embodiment, a single via chip 104 may be disposed in the molded substrate 202, with two or more dies 102 disposed at the molded substrate 202 so that the via chip 104 is disposed between at least two dies 102.

Thus, in view of the foregoing, a method for forming a fan-out wafer level package structure may comprise applying an active device or die 102 over a carrier 112, the die 102 having a plurality of mounts 114, providing one or more vias 106 on the carrier 112 and forming a molded substrate 202 over the carrier 112 and around the vias 106. The molded substrate 202 may be reduced on a first side 202b that is opposite the carrier 112 to expose vias 106. In some embodiments, mounts 114 on the die 102 may also be exposed through the first side 202b of the molded substrate 202. The ends of the vias 106 and the mounts 114 of the die 102 exposed through the first side 202b of the molded substrate 202 may be substantially planar with the first side 202b of the molded substrate 202. An adhesive layer 110 may optionally be disposed on the carrier 112, and the die and vias attached to the carrier 112 by way of the adhesive layer 110. Additionally, the molded substrate 202 may be formed on the adhesive layer 110.

Via chips 104 having vias 106, and optionally, one or more dielectric layers 108 separating the vias 106 may be used to provide the vias 106 on the carrier 112 or adhesive layer 110. The via chips 104 may be formed separate and away from the carrier 112 and adhesive layer 110 and prior to placement of the one or more via chips 104 on the adhesive layer 110. The dielectric layer 108 of the via chips 104 may separate the vias 106 from the molded substrate 202, the dielectric layer 108 comprising a material different from the molded substrate 202. In one embodiment, the molded substrate 202 may have least two via chips 104, with the die 102 disposed between the via chips 104. In another embodiment, the molded substrate 202 may have at least two dies 102 on the adhesive layer 110 and a via chip 104 disposed between the two dies 102.

An RDL 402 having a plurality of RDL contact pads 404 and conductive lines 406 may be formed on first side 202b of the molded substrate 202. The RDL contact pads 404 may have a bond pitch greater than a bond pitch of the mounts 114 of the die 102, and package mounts 502 may be disposed on the RDL contact pads 404.

The carrier 112 may be debonded and the adhesive layer 110 removed. One or more vias 106 may be exposed through the second side of the molded substrate 202 opposite the first side 202b. A second structure 802 may be mounted at the second side of the molded substrate 202, the second structure 802 having at least one die 102 disposed thereon and in electrical communication with at least one via 106. In one embodiment, a die 102 on the second structure 802 in electrical communication with at least one RDL contact pad 404 by way of at least a via 106.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, dies and vias may be attached to the carrier by any suitable means sufficient to retain the structure in place for application of the molding compound 202a. As another example, it will be readily understood by those skilled in the art that many of the steps for creating a fan-out wafer level structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. An package comprising:
   a planar first surface, the planar first surface comprising a first external contact of a first die, a molding compound, and a via located within a via die, wherein the via extends from a first side of the via die to a second side of the via die, wherein the via has a straight sidewall as it extends from the first side to the second side; and
   a redistribution layer over the molding compound, the first via, and the first die die, wherein the planar first surface further comprises a second die.

2. The package of claim 1, wherein the via is in contact with a dielectric material different from the molding compound.

3. The package of claim 1, wherein the first die comprises first die mounts.

4. The package of claim 3, wherein the first die mounts comprise pins.

5. The package of claim 3, wherein the first die mounts comprise mounting pads.

6. The package of claim 3, wherein the first die mounts comprise lands.

7. The package of claim 1, further comprising a wide I/O DRAM chip connected to the via.

8. A package comprising:
a redistribution layer electrically connecting external connectors to a semiconductor die;
a via die electrically connected to the redistribution layer, the via die being separated from the semiconductor die by a molding compound, the molding compound having a planar surface facing the redistribution layer;
a through via extending through the via die, the through via having straight sidewalls all the way through the via die; and
a second semiconductor device bonded to the through via.

9. A package comprising:
a first die embedded within a molding compound;
a first via extending from a first side of the molding compound to a second side of the molding compound, the first via having straight sidewalls from a first side of the first via to a second side of the first via;
a first dielectric separating the first via from the molding compound, wherein the first die, the molding compound, the first via, and the first dielectric are planar with each other along at least two surfaces;
a redistribution layer electrically connected to the first die and the first via; and
a second semiconductor device electrically connected to the first via, the second semiconductor device being located on an opposite side of the first die from the redistribution layer.

10. The package of claim 9, wherein the second semiconductor device is a wide I/O DRAM device.

11. The package of claim 9, wherein the first die comprises first die mounts.

12. The package of claim 11, wherein the first die mounts comprise pins.

13. The package of claim 11, wherein the first die mounts comprise contacts.

14. The package of claim 11, wherein the first die mounts comprise mounting pads.

15. The package of claim 9, wherein the first via comprises copper.

16. The package of claim 9, wherein the first via comprises aluminum.

17. The package of claim 8, wherein the second semiconductor device comprises a wide I/O DRAM device.

18. The package of claim 8, wherein the external connectors are part of a ball grid array.

19. The package of claim 8, wherein the external connectors are part of a land grid array.

20. The package of claim 8, wherein the external connectors are part of a pin array.

* * * * *